(12) United States Patent
Beadle et al.

(10) Patent No.: US 6,208,544 B1
(45) Date of Patent: Mar. 27, 2001

(54) CONTENT ADDRESSABLE MEMORY CELL PROVIDING SIMULTANEOUS READ AND COMPARE CAPABILITY

(75) Inventors: Edward R. Beadle, Melbourne; John F. Dishman, Palm Bay, both of FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/391,918

(22) Filed: Sep. 9, 1999

(51) Int. Cl.[7] ............................. G11C 15/00; G11C 16/04
(52) U.S. Cl. ......................................... 365/49; 365/180.07
(58) Field of Search ................................... 365/49, 189.07

(56) References Cited

U.S. PATENT DOCUMENTS

| | | | |
|---|---|---|---|
| 4,065,756 | * 12/1977 | Panigrahi | 365/49 |
| 4,219,883 | * 8/1980 | Kobayashi et al. | 365/49 |
| 4,959,811 | * 9/1990 | Szczepanek | 365/49 |
| 5,010,516 | * 4/1991 | Oates | 365/49 |
| 5,018,099 | * 5/1991 | Burrows | 365/49 |
| 5,455,784 | * 10/1995 | Yamada | 365/49 |

\* cited by examiner

*Primary Examiner*—Trong Phan
(74) *Attorney, Agent, or Firm*—Allen, Dyer, Doppelt, Milbrath & Gilchrist, P.A.

(57) ABSTRACT

The need to employ three separate cycles for write, read and compare operations for operation of a content addressable memory cell is obviated by a memory cell architecture that allows simultaneous read and compare operations, thereby reducing memory cycle time by one-third of that of a conventional CAM. To enable the data bit stored in the memory cell to be compared with a reference bit, the memory cell is coupled with a comparator, that receives inputs from the data nodes of the memory cell and a set of comparison bit input lines. Rather than supplying reference data by way of the data lines through which data is written into and read from the memory cell, as in a conventional CAM, the compare bit and its complement are coupled to the match logic exclusively of the memory cell. Since application of the comparison bit does not involve the use of the normal data read and write lines, accessing data read and write paths for the memory cell is not required. As a consequence, a read cycle and a comparison cycle may be performed simultaneously, without one affecting the other.

6 Claims, 1 Drawing Sheet

CONTENT ADDRESSABLE MEMORY CELL PROVIDING SIMULTANEOUS READ AND COMPARE CAPABILITY

CROSS-REFERENCE TO RELATED APPLICATIONS

The present application relates to subject matter disclosed in coincidentally filed U.S. patent application, Ser. No. 09/391,919, by E. Beadle et al, entitled: "Dual Key Controlled Content Addressable Memory for Accessing Packet Switch Data Buffer for Multicasting Data Packets (hereinafter referred to as the '919 application), assigned to the assignee of the present application and the disclosure of which is incorporated herein.

FIELD OF THE INVENTION

The present invention relates in general to digital data storage circuitry, and is particularly directed to a new and improved content addressable, or associative, memory cell architecture, that is configured to allow simultaneous read and compare operations.

BACKGROUND OF THE INVENTION

Because digital signal processing circuit designers continue to use the same hardware building blocks, such as the (static) random access memory (RAM), MOSFET-configured, data bit cell diagrammatically illustrated in FIG. 1, to implement a variety of product designs, enhancements in system performance have been essentially governed by improvements in line widths and manufacturing processes of integrated circuit components that enable data processing architectures to operate at faster speeds and store more data in smaller volumes of semiconductor material.

Although the memory cell of FIG. 1 is shown as a metal oxide semiconductor (MOS) transistor-configured cell, it should be observed that the cell may be implemented using other components, such as but not limited to bipolar devices, biCMOS devices, and the like. In the example shown in FIG. 1, the MOSFET memory cell, shown at 10, is comprised of a pair of cross-connected inverters 11 and 12 that are coupled to power supply rails $V_{DD}$, $V_{GG}$ and ground (GND), and having complementary data bit nodes D and D BAR that store complementary bit logic levels representative of the data bit stored in the cell. MOS transistors T1 and T2 are the respective drive and load transistors of inverter 11, while MOS transistors T3 and T4 are the respective drive and load transistors of the other inverter 12. Within a memory comprised of two-dimensional array of such cells, the X and Y locations, and therefore the address, of the memory cell are defined by an X node 21, that is coupled to the X address node of other memory cells of the same row of the memory array, and a Y node 22, that is coupled to the Y address node of other memory cells of the same column of the memory array.

The X node 21 is coupled to the gates of row address transistors T5 and T6, which have their source-drain paths coupled between respective data nodes D and D BAR and complementary Data and Data BAR lines 31 and 32. The Data and Data BAR lines 31 and 32 are coupled to other memory cells of the same Y column of the memory array. The Y node 22 is coupled the gates of column address transistors T7 and T8, which have their source-drain paths respectively coupled in circuit with the source-drain path of a data input (or write) transistor T9 and a data output (or read) transistor T10.

To store or write data into the memory cell, the source-drain path of data input transistor T9 is coupled to a data input (Data in) node 41 and its gate is coupled to receive a write control signal W. To read data from the memory cell, the source-drain path of data output transistor T10 is coupled to a data output (Data Bar out) node 42 and its gate is coupled to receive a read control signal R. When writing or reading data, the cell is addressed by applying a prescribed logic level (e.g., '1') to the respective X and Y,address nodes 21 and 22, so as to turn on transistors T5, T6, T7 and T8. With transistors T5 and T7 turned on, the data node D is coupled to data input transistor T9, while the complementary data node D BAR is coupled to the data output transistor T10.

In order to write data into the memory cell 10, the write control input W to the gate of data input transistor T9 is asserted at a prescribed logical state (e.g., '1'), while the read control input R to the gate of data output transistor T10 is asserted at a complementary logical state (e.g., '0'), thereby turning on transistor T9 and holding transistor T10 off during a respective 'write cycle'. If the bit value applied to the Data in node 41 is a '1', the resulting '1' at data node D turns on transistor T3, thereby coupling the complementary data node D BAR to GND or '0'. Namely, the data line 31 is at the input data value '1', while the complementary data line D BAR 32 is at a logical '0' value. On the other hand, if the bit value applied to the Data in node 41 is a '0', the resulting '01' at data node D turns transistor T3 off, so that complementary data node D BAR is at a logical '1'. In this case, the data line 31 is at the input data value '0', while the complementary data line D BAR 32 is at a logical '1' value.

To read data from the memory cell 10, the read control input R to the gate of data input transistor T10 is asserted at a prescribed logical state (e.g., '1'), while the write control input W to the gate of data input transistor T9 is asserted at a prescribed complementary logical state (e.g., '0'), thereby turning on transistor T10 and holding transistor T9 off. Since each of transistors T5, T6, T7 and T8 is turned on, then during this 'read cycle', whatever bit value is stored in the memory cell 10 will be coupled to Data line 31, while its complement will be coupled to Data BAR line 32.

In addition to being selectively addressable so as to allow data to be written into or read out, the memory cell may be configured as an associative or content addressable memory (CAM) cell, that enables its stored data bit to be compared or associated with a prescribed 'comparison' bit value. For this purpose, the memory cell of FIG. 1 may be augmented as diagrammatically illustrated in FIG. 2 to include a bit value comparator or 'match' circuit 50, that is coupled to the data nodes and data lines of the cell.

A typical comparator employed for this purpose may comprise an exclusive NOR circuit having first and second pairs of sense transistors T11–T13 and T12–T14, with their drain-source paths coupled in circuit between a reference potential node (e.g., GND) and a compare or 'MATCH' line 51, that is wire-AND coupled to other cells of the same word's key field. The gate of transistor T11 is coupled to the data line side of the source-drain path of transistor T5, while the 'sense' input or gate of transistor T13 is coupled to the data node D of the memory cell 10. On the complementary side, the gate of transistor T12 is coupled to the Data line BAR side of the source-drain path of transistor T6, while the 'sense' gate of transistor T14 is coupled to the data node D BAR of memory cell 10.

This auxiliary comparator circuitry allows the content addressable memory cell configuration of FIG. 2 to conduct an associative or comparison operation during a match cycle that is separate from the write and read cycles in the manner described above with reference to FIG. 1. In particular, during a comparison cycle, the match line 51 is charged to a prescribed (high) level. Since the purpose of an associative operation is to 'assert data' and 'read address information', the X address node 21 is asserted low, so as keep transistors T5 and T6 turned off, thereby isolating the memory cell and preventing its contents from being affected by the comparison operation being performed. Also, the write W and read R control inputs are controllably multiplexed, so as to couple comparison data to the data lines through the input transistor T9 and the data output transistor T10.

Namely, the data bit and its complement with which the bit stored in the memory cell is to be compared are selectively applied to the Data BAR line 32 and its complement Data line 31, by turning on the transistors T9 and T10, the source-drain paths of which are coupled to the gates of transistors T12 and T11. Since the 'sense' gate of transistor T13 is coupled to the data node D and the 'sense' gate of transistor T14 is coupled to the data node D BAR of the memory cell 10, a 'match' can occur only if the stored bit and the comparison bit have the same value.

Because both the write or data input transistor T9 and the read or data output transistor T10 are employed during a comparison cycle in the conventional CAM of FIG. 2, not only are the read and compare operations performed mutually exclusively from a memory cell write cycle (which must occur for proper operation of the memory cell), but they are performed mutually exclusively of each other (which is not absolutely essential for memory cell operation). This use of separate cycles for read and compare modes constitutes an unnecessary impairment to the performance potential of the memory cell.

SUMMARY OF THE INVENTION

In accordance with the present invention, the above described necessity of using three separate cycles for write, read and compare operations for operation of a content addressable memory cell is effectively obviated by a memory cell architecture that is configured to allow simultaneous read and compare operations, thereby reducing memory cycle time by one-third of that of a conventional CAM. For this purpose, for data storage and read-out, the improved content addressable memory cell of the invention may employ a conventional memory cell arrangement, such as, but not limited to the memory cell of FIG. 1, described above. To enable the data bit stored in the memory cell to be compared with a 'comparison' bit value, the memory cell is further coupled with a bit value comparator, that receives inputs from the data nodes of the memory cell and a set of comparison bit input lines.

As in the CAM cell of FIG. 2, the bit value comparator may comprise an exclusive NOR circuit, containing first and second pairs of sense transistors coupled in circuit between a reference potential node and a match line. The 'sense' gate of one transistor is coupled to the memory cell's data node D and, on the complementary side, the 'sense' gate of another transistor is coupled to the cell's complementary data node D BAR. Rather than supplying comparison data to the comparison bit input transistors of the exclusive NOR circuit by way of the data lines through which data is written into and read from the memory cell, as in the conventional CAM of FIG. 2, the compare bit and its complement are coupled to the match logic exclusively of the memory cell.

As application of the comparison bit does not involve the use of a connection between the data lines and the comparison circuit, accessing the data read and write paths for the memory cell is not required. This means that a read cycle and a comparison cycle may be performed simultaneously, without one affecting the other. Just as in the operation of a conventional CAM architecture of FIG. 2, the read and compare operations are always performed mutually exclusively from a memory cell write cycle, so as to ensure proper operation of the memory cell. However, since read and compare operations can now be performed simultaneously during the same cycle, rather than mutually exclusively of each other, the invention is able to reduce the memory cycle time (by one-third of that of a conventional CAM of a chip using a read-write-compare of 50% for read-compare).

DETAILED DESCRIPTION

Figure 3:
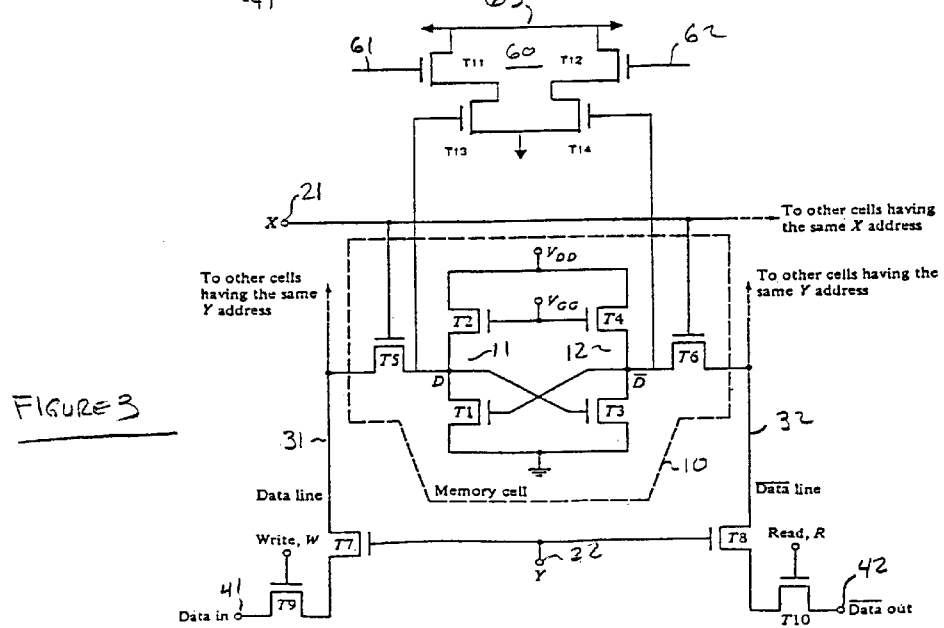
FIG. 3 is a circuit diagram of a content addressable memory cell in accordance with the present invention.

FIG. 3 diagrammatically illustrates a content addressable memory (CAM) cell that is configured to allow simultaneous read and compare operations according to the present invention, as applied to a static RAM architecture, as a non-limiting example. Although the illustrated embodiment is that of a static RAM, from the description herein it will be readily appreciated that the invention is equally applicable to a dynamic RAM architecture. Moreover, although the illustrated embodiment of FIG. 3 is shown as a metal oxide semiconductor (MOS) transistor-configured CAM cell, as noted previously with respect to FIG. 1, it should be observed that the CAM cell of FIG. 3 may be implemented using other components, such as but not limited to bipolar devices, biCMOS devices, and the like.

Figure 1:
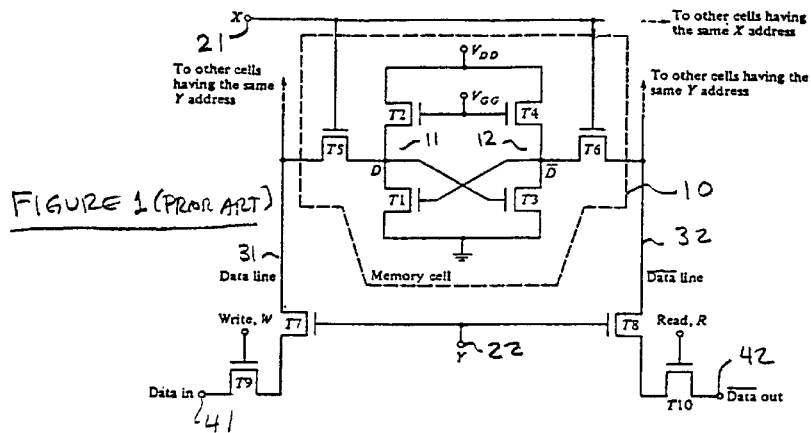
FIG. 1 is a circuit diagram of a conventional data bit memory cell.
Figure 2:
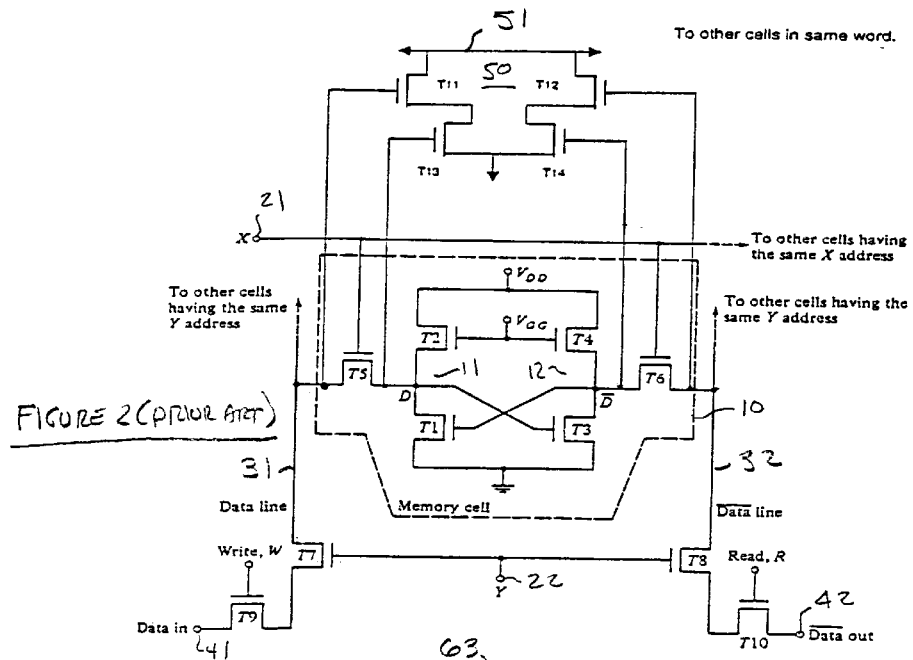
FIG. 2 is a circuit diagram of a conventional content addressable memory cell.

As in the CAM architecture of FIG. 2, the memory cell proper of FIG. 3 may be configured essentially as the memory cell of FIG. 1. In addition, to enable the data bit stored in the memory cell 10 to be compared with a prescribed 'comparison' or 'reference' bit value, the memory cell 10 is augmented to include a bit value comparator circuit 60 that is coupled to the data nodes of the memory cell, and to a set of comparison bit lines 61 and 62.

As in the CAM architecture of FIG. 2, the bit value comparator 60 of FIG. 3 is shown as comprising an exclusive NOR circuit, containing first and second pairs of sense transistors T11–T13 and T12–T14, having their drain-source paths coupled in circuit between a reference potential node (e.g., GND) and a 'MATCH' line 63, that is wire-AND coupled to other cells of the same data word. The 'sense' gate of transistor T13 is coupled to the data node D of the memory cell 10 and, on the complementary side, the 'sense' gate of transistor T14 is coupled to the data node D BAR of the memory cell 10.

However, rather than derive the compare bit and its complement by way of the data lines 32 and 31 (which requires the use of the data read and write nodes 41 and 42, as described above with reference to FIG. 2), these (compare and its complement) bit values are coupled directly to the gate of transistor T11 and the gate of transistor T12 by way of the comparison bit lines 61 and 62, respectively as shown. As in the conventional CAM architecture of FIG. 2, the match line 63 is charged to a prescribed high level. Since the gate of the transistor T13 is coupled to the data node D and the gate of the complementary sense transistor T14 is coupled to the data node D BAR of the memory cell 10, a 'match' will occur only if the stored bit and the comparison bit have the same value.

Because application of the comparison bit (applied via input lines 61 and 62) to the match logic does not involve the use of a connection between the data lines 31 and 32 and the comparison circuit 60, accessing the data read and write paths for the memory cell 10 is not required. This means that a read cycle and a comparison cycle may be performed simultaneously during the same cycle, as described above, without one affecting the other. Just as in the operation of a conventional CAM architecture of FIG. 2, the read and compare operations are always performed mutually exclusively from a memory cell write cycle, so as to ensure proper operation of the memory cell.

However, since the invention allows read and compare cycle to be performed simultaneously, rather than having to be performed in conventional manner, using separate cycles that are mutually exclusive of each other, the invention is able to reduce the memory cycle time (by one-third of that) of a conventional CAM. This performance improvement is especially valuable in time-critical applications, such as packet switch buffer management. As a non-limiting example, the content addressable memory cell architecture of the present invention may be employed in a packet buffer switch management system for multicasting data packets, described in the above-referenced '919 application.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A content addressable memory comprising:

a data bit storage cell;

a data input through which a data bit is written into said data bit storage cell during a write cycle;

a data output through which the data bit stored in said data bit storage cell is read out therefrom during a read cycle;

an address circuit through which said data bit storage cell is selectively accessed during said read and write cycles; and a data bit comparator coupled to said data bit storage cell and being configured to determine whether the data bit stored in said data bit storage cell matches a data reference bit that is applied thereto, simultaneously with the reading out of the data bit in accordance with selective accessing of said bit storage cell by said address circuit during said read cycle, and also to determine whether the data bit stored in said data bit storage cell matches a data reference bit that is applied thereto irrespective of whether or not said data bit storage cell is accessed by said address circuit to read out the data bit stored therein.

2. A content addressable data bit storage cell according to claim 1, wherein said data bit storage cell comprises first and second cross-coupled inverters having respective first and second data nodes, and said address circuit comprises first and second address switches respectively coupled in circuit with said first and second data nodes and first and second data access nodes; and further including a data input switch coupled in circuit with said data input and said first data access node; and a data output switch coupled in circuit with said data output and said data access node; and wherein said data bit comparator has first and second compare input nodes coupled to said first and second data nodes, and first and second reference nodes that are respectively coupled to receive said data reference bit and the complement of said data reference bit, and an output node having a logic state representative of whether or not said data bit stored by said data bit storage cell matches said data reference bit.

3. A memory cell comprising:

a data bit storage cell having a data input through which a data bit is written into said data bit storage cell, a data output through which a data bit is read out of said data bit storage cell, and an address input through which said data bit storage cell is selectively accessed; and a data bit comparator coupled to said data bit storage cell and being configured to determine whether the data bit stored in said data bit storage cell matches a reference data bit that is applied thereto during selective accessing of sid bit storage cell by said address circuit for a read cycle for said data bit storage cell, and also to determine whether the data bit stored in said data bit storage cell matches a data reference bit that is applied thereto irrespective of whether or not said data bit storage cell is accessed by said address circuit to read out the data bit stored therein.

4. A method of operating a data bit storage cell having a data input through which a data bit is written into said data bit storage cell, a data output through which a data bit is read out of said data bit storage cell, and an address input through which said data bit storage cell is selectively accessed during read and write cycles, said method comprising:

(a) during a read cycle, selectively accessing said data bit storage cell by way of said address input thereof, and thereby reading out said data bit from said data bit storage cell and also determining whether the data bit stored in said data bit storage cell matches a reference data bit; and (b) irrespective of selective accessing of said data bit storage cell by way of said address input thereof, determining whether the data bit stored in said data bit storage cell matches a reference data bit.

5. A memory cell comprising:

a data bit storage cell containing first and second cross-coupled inverters having respective first and second data nodes, and first and second address switches coupled in circuit with said first and second data nodes and first and second data access nodes;

a data input switch coupled in circuit with a data input node and said first data access node;

a data output switch coupled in circuit with a data output node and said data access node; and a comparator having first and second compare input nodes coupled to said first and second data nodes, and first and second reference nodes respectively coupled to receive a data reference bit to be compared and the complement of said data reference bit to be compared, exclusive of operation of either of said first and second address switches and thereby signal paths to said first and second data access nodes, and an output node having a logic state representative of whether or not said data bit stored by said data bit storage cell matches said data reference bit irrespective of said operation of either of said first and second address switches.

6. A memory cell according to claim 5, wherein said comparator is configured to determine whether the data bit stored in said data bit storage cell matches said data reference bit during a read cycle for said data bit storage cell.

* * * * *